(12) United States Patent
Rosener

(10) Patent No.: US 8,872,429 B2
(45) Date of Patent: Oct. 28, 2014

(54) PULSED PLASMA GENERATOR

(76) Inventor: Kirk Rosener, San Antonio, TX (US)

( * ) Notice: Subject to any disclaimer, the term of this patent is extended or adjusted under 35 U.S.C. 154(b) by 518 days.

(21) Appl. No.: 13/192,623

(22) Filed: Jul. 28, 2011

(65) Prior Publication Data

US 2013/0026919 A1    Jan. 31, 2013

(51) Int. Cl.
*H01J 7/24*       (2006.01)
*H05H 1/48*      (2006.01)

(52) U.S. Cl.
CPC ........... *H05H 1/48* (2013.01); *H05H 2001/481* (2013.01)
USPC .................................................. 315/111.81

(58) Field of Classification Search
USPC ............. 315/111.11, 111.41, 111.71, 111.91, 315/111.81; 250/423 R, 427, 423 P, 423 F; 313/362.1, 359.1
See application file for complete search history.

(56) References Cited

U.S. PATENT DOCUMENTS

| | | | |
|---|---|---|---|
| 3,288,641 A | 11/1966 | Rightmire | |
| 3,424,904 A | 1/1969 | Donnally | |
| 4,339,691 A | 7/1982 | Morimiya et al. | |
| 4,363,774 A | 12/1982 | Bennett | |
| 4,749,910 A | 6/1988 | Hara et al. | |
| 4,841,197 A | 6/1989 | Takayama et al. | |
| 5,391,962 A * | 2/1995 | Roberts et al. | 313/362.1 |
| 5,581,156 A | 12/1996 | Roberts et al. | |
| 5,880,581 A | 3/1999 | Yang | |
| 6,137,231 A * | 10/2000 | Anders et al. | 315/111.21 |
| 6,452,194 B2 * | 9/2002 | Bijkerk et al. | 250/492.2 |
| 6,624,584 B2 * | 9/2003 | Schmidt-Boecking et al. | 315/111.81 |
| 6,758,199 B2 | 7/2004 | Masters et al. | |
| 6,805,779 B2 | 10/2004 | Chistyakov | |
| 6,849,854 B2 * | 2/2005 | Sainty | 250/423 R |
| 6,873,086 B2 * | 3/2005 | Fujimura et al. | 310/318 |
| 7,116,054 B2 * | 10/2006 | Zhurin | 315/111.41 |
| 2002/1085229 | 12/2002 | Brcka | |

OTHER PUBLICATIONS

Cady, W.G.: Piezoelectricity, 1964, pp. 536-537, Dover Publications, USA.
Von Lenard P. E: On Cathode Rays, 1906, pp. 118, 123, 129-130, Nobel Lecture, Oslo, Norway.
Rutherford, E. The Constitution of Matter and the Evolution of the Elements, 1914, 182-183, plt3-4, Presentation to the National Academy of Sciences, Washington, D.C.
Compton, A.H.: X-Rays in Theory and Experiment, 2nd Edition 1935, pp. 11-18, D. Van Nostrand Company, NY.
Thomson, J.J.: Conduction of Electricity Through Gases, 1st Ed, 1903, pp. 244-251, 258-273, Cambridge at the University Press, London, England.
Tesla, N: On the Source of Roentgen Rays and the Practical Construction and Safe Operation of Lenard Tubes, Aug. 11, 1897, 31/.4: pp. 67-71 Electrical Review, N.Y., USA.

* cited by examiner

*Primary Examiner* — Minh D A

(57) ABSTRACT

A pulsed electrostatic/electric field generator apparatus providing a source of large quantity, free slow-speed high energy free electrons, or high energy positive ions, contained in an electrostatic/electric field capacity exceeding 1 Joule. The pulsed electrostatic/electric field generator apparatus encapsulates an enclosed non-equilibrium, non-thermal pulsed power plasma. A key subcomponent of this apparatus incorporates an innovative unipolar piezoelectric capacitor creating high voltage nanosecond rise time pulses in a multistage high energy step-up pulsed plasma generation sequence of steps. The resulting multi-Joule electrostatic/electric field is then tapped to provide a source of current and/or potential for use by external loads.

14 Claims, 3 Drawing Sheets

Figure 3:
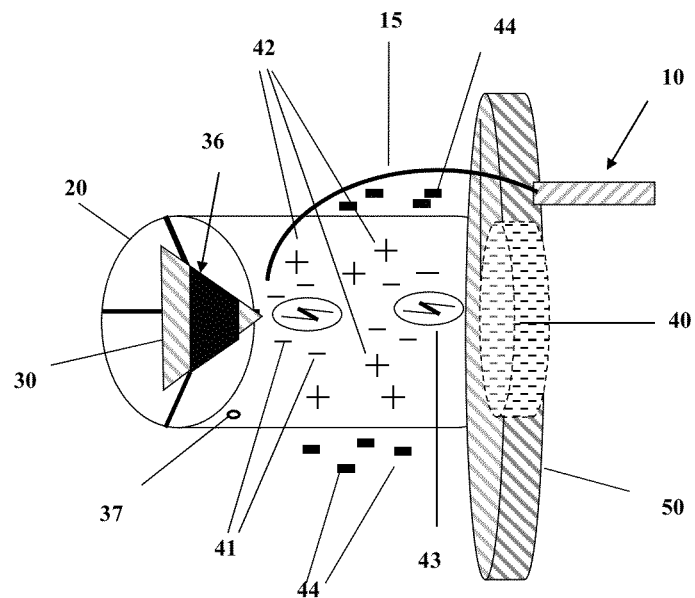

Fig. 1
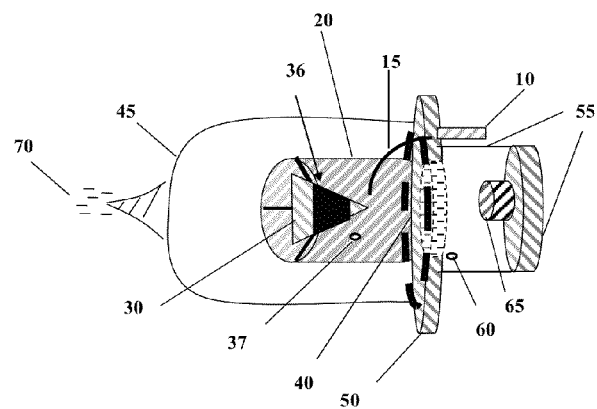
Fig. 2
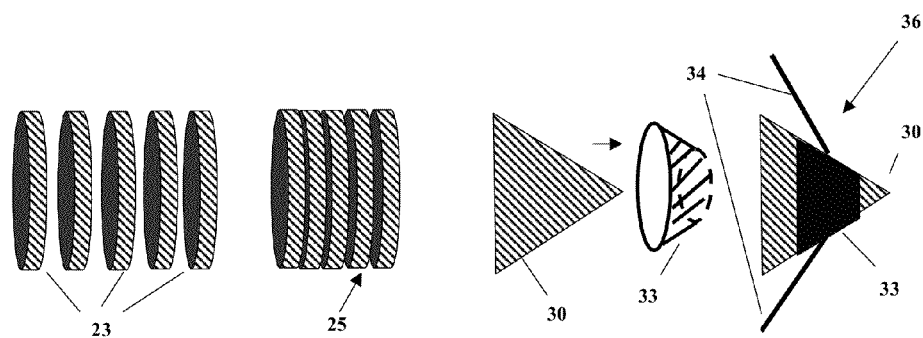
Fig 2A  Fig 2B  Fig 2C  Fig 2D

PULSED PLASMA GENERATOR

CROSS-REFERENCE TO RELATED APPLICATIONS

None

FEDERALLY SPONSORED RESEARCH

Not Applicable

SEQUENCE LISTING OR PROGRAM

Not Applicable

BACKGROUND OF THE INVENTION

1. Field of Invention

The Pulsed Plasma Generator (PPG) is a high-voltage generator producing electrons, or positive ions, through a multi-stage, non-equilibrium, non-thermal, non-magnetic pulsed plasma method using externally provided energy. Energy pulse events occur through a multi-stage energy concentration sequence within the apparatus. This sequence includes methods to concentrate electrostatic/electric energy that is subsequently released from a uniquely designed electron emissive device. The timed release of the concentrated electron energy from the electron emissive device is in the form of a plurality of non-nuclear energetic electrons. These electrons drive subsequent events creating bremsstrahlung photons interacting within molecules residing within a compressed gas. Results of these interactions emit free electrons at high energy levels from the lower valence levels of the compressed gas molecules. These high energy free electrons are used as a source of current and/or potential energy for use by external loads. The emitted free electrons of the PPG exceed one megavolt, at energy levels exceeding one Joule.

2. Prior Art

Prior art limitations using pulsed plasma techniques to emit electrons at significant Joule energy level potentials, involve reliance on inefficient plasma generation techniques. These limitations include the inability to generate high energy electrons possessing fast rise time voltage pulses characteristics or methods in creating effective quantities of bremsstrahlung photons. The primary components of the low efficiency electron generation methods described in the prior art include capacitor construction limitations, as well as inherent thermal and inductive losses.

In U.S. Pat. No. 4,363,774 Bennett describes an apparatus that projects ions having atomic number masses greater than 40 at high velocities into high density nuclei residing within a target. Using ions at these levels of mass will significantly decrease the effectiveness of the bremsstrahlung photon generation method further described in this application.

The description of the Bennett apparatus includes the creation of high current electron pulses possessing velocity and energy levels at frequencies characteristic of X-ray/alpha particle ranges and above. The PPG apparatus cannot efficiently perform as an electron emissive device in this range of frequencies. The optimal performance range of the PPG high voltage, low current pulses occurs in a lower range of frequencies associated with cathode rays.

Finally, the Bennett apparatus relies on a beam concentrating technique that the high current electron pulses must flow through. In contrast the PPG apparatus relies on a beam forming technique that relies on the diameter of the beam being equal to the diameter of the target used to generate the bremsstrahlung photons. The diameter of the energy beam created within the PPG apparatus is several orders of magnitude greater than the diameter of the energetic beam described by Bennett.

U.S. Pat. No. 6,849,854 describes prior art with means for producing ions by first bombarding a fluent material with electrons from an anode. This apparatus then applies a magnetic field concentrating the flow of electrons to the center of the anode. The inductive characteristics of this apparatus in using magnetic fields to penetrate into the contained gas, significantly lowers the rise time of the leading edge of the magnetic generated pulse of energy in creating ionized plasma. The lower rise time the leading edge of this magnetic pulse of energy, directly corresponds to fewer electrons/positive ions per unit of time being created from the outer valence bands of the gaseous molecules residing within the plasma. The rise time of the magnetic pulse of energy continues to decrease the further that this magnetic generated pulse of energy penetrates into the contained gas. This limitation decreases the overall efficiency of the plasma generation when this type of method is used, as measured in the amount of electrons/ions being generated, compared to the total number of gaseous molecules available for creating plasma. The fastest magnetic generated energy pulse rise times achieved using inductively oriented magnetic field methods are tens of microseconds or greater, as compared to the several hundred nanosecond voltage rise time occurring within the PPG apparatus.

In U.S. Pat. No. 4,339,691, Morimiya, et al., describe a discharge apparatus containing an evacuated vacuum envelope. In the envelope, an anode and a hollow cathode are disposed and connected to an arc power supply generating periodic spark discharges between two oppositely charged electrodes. This approach provides a smaller quantity of ions per unit of time as compared to a continuous flow of electrostatic/electric field energy via a brush or corona discharge. The Morimiya, et al. apparatus also relies on a continuous flow of gas into the evacuated chamber, rather than a containment of the gas in a non-gas replacement configuration occurring during each spark discharge event.

Further, U.S. Pat. No. 4,339,691 Uses a magnetic component to prohibit lateral expansion of ions as they are focused towards an aperture in which the electron beam exits the apparatus. No embodiment was disclosed where anything other than a magnetic field approach could be used to focus the electron beam.

U.S. Pat. No. 4,749,910—This patent describes an electron beam-excited ion beam source where a discharge occurs between a flat plate electrode and a cathode. These plates are connected across both sides of a power source, rather than using only a single pole source of energy. In addition, a beam of elevated energy is described that is forced through an aperture in a plate. This approach is the only method described in transporting the elevated energy outside of the apparatus. This patent is silent on using an approach of projecting the beam of elevated energy onto a plate with no apertures.

U.S. Pat. No. 6,624,584—This patent describes a source for producing excited particles where two volumes are connected to each other through an aperture provided at the partition between the two volumes. The gas in the first volume is maintained at a higher pressure. As the gas in the first volume is excited to a higher energy state, it flows through the aperture in the partition into the second volume maintained at a lower pressure. This patent does not describe any embodiment that does not include an aperture. In addition, this patent does not describe any embodiment where a low-pressure gas is maintained in a first volume, and a higher pressure gas concurrently maintained in a second volume.

U.S. Pat. No. 4,841,197—This patent describes an ion source, including an electric discharge chamber body divided by a partition, containing an anode electrode. The second discharge chamber has a tungsten filament mounted therein aligned with at least one small aperture. This aperture is positioned in the partition wall separating the first chamber and the second chamber. In addition a magnetic field is established along an axis of the at least one small opening in the anode electrode. This patent does not describe any embodiment that does not contain apertures or does not use magnetic fields.

U.S. Pat. No. 6,805,779—This patent describes an energy source exciting energized atoms provided in a feed gas, surrounded by a magnetic field. This method excites the atoms into an ionized state, thereby generating plasma with multi-step sequences of ionization. This patent does not describe any embodiment that does not use a flow of gas or the use of anything other than magnetic fields to excite energized atoms.

U.S. Pat. No. 1,085,229 (patent application Dec. 12, 2002)—The basic principle of inductively coupled plasma (ICP), as described by the patents in this class, requires the use of a frequency based power source sending energy through conductive wires or rods surrounding a container of gas maintained at low pressure. The supplied energy inductively couples into the gas thereby creating plasma. The creation of plasma is through vibrational frequency excitation methods separating electrons from the outer valence levels of their respective gas molecules leaving positive ions. The use of ICP patents relying on high frequency energy frequency input pulses create conditions where the oscillation between the negative and positive energy values significantly limit the amount of free electrons generated.

The inductively coupled approach further contributes to the limitations of efficiently generating free electrons. This occurs through the application of the induced energy flowing from outside the volume of gas towards the center of this gas being maintained in a low pressure. This approach creates an inductive "skin effect" limitation. This limitation occurs as the induced energy penetrates each layer of the gas maintained under low pressure. Heat is created by the collisions of the molecules of the gas as the induced energy penetrates deeper into the gas. As the temperature of the gas increases based on these collisions, the heat is transferred into the deeper internal layers of the gas creating additional collisions per unit area. This inefficient method continues to expand with each deeper layer of the gas that the induced energy penetrates. This "skin effect" limitation results in extremely low energy efficiencies with respect to the number of free electrons generated, versus the amount of induced energy injected into the gas. A large portion of the ICP energy generated to create plasma is lost in the form of waste heat as a byproduct of the "skin effect" condition.

U.S. Pat. No. 5,581,156—The end goal of this patent is to produce a negative ion source. As portion of the method performed to reach this end product creates and confines plasma to produce free electrons from the outer valence levels of the targeted gaseous molecules, as well as excited neutral molecules, and excited ions. The confinement is obtained by various magnetic field configurations produced by permanent magnets. While this patent uses two chambers to create the end product of negative ions, both chambers contain apertures. This patent does not describe any embodiment that does not allow a flow of gas through apertures or the use of magnetic fields.

U.S. Pat. No. 6,758,199—This patent describes a piezoelectric subcomponent used as an impedance matching method. This subcomponent is located within the transformer and generates a periodic spark discharge between a cathode and an anode contained within a closed circuit. This patent does not describe any embodiment using a brush or corona discharge in a continuous charging mode, rather than a periodic point in time spark discharge. In addition, this patent does not describe methods using an open circuit with a cathode projecting electrons into plasma.

U.S. Pat. No. 5,880,581—This patent describes a circuit using a unipolar capacitor. This patent is representative of the previous art in capacitor design. This design assumes current flowing through two conductive wires attached to two plates of the capacitor in a closed loop circuit configuration. One lead is maintained at a higher potential than the conductive lead connected to a second plate of the capacitor. The term "bipolar" capacitor is used hereinafter to describe this type of two-plate capacitor configuration.

The bipolar capacitor approach relies on current flowing through two plates of the capacitor to store energy within the dielectric of the bipolar capacitor. However, this approach also contributes to limiting the initial rise time of the leading edge of the voltage pulse when energy is released from a bipolar capacitor. This limitation is that a residual charge remains on each of the plates of the bipolar capacitor once the current ceases flowing. This limitation in turn reduces the electrical relaxation time function of the bipolar capacitor dielectric material. This limitation also limits the rise time of the leading edge of the subsequently released energy of the bipolar capacitor in the form of a voltage pulse to microseconds or greater.

In addition to the above limitations, U.S. Pat. No. 5,880,581 does not describe any embodiments allowing a brush or corona discharge of energy into the bipolar capacitor. Nor does this patent describe any embodiments where a one-plate capacitor configuration is used.

U.S. Pat. No. 3,288,641—This patent describes a high capacitive energy storage device in a double layer interface. This approach stores high levels of DC voltage provided energy to be released in a subsequent capacitive discharge event. However the high energy fast rise time leading edge pulses flowing from a high voltage capacitor are limited by the internal inductance of the dipole moment relaxation of the capacitor's dielectric material. The design characteristics of the dielectric material and physical configuration of the capacitor have attributes including high levels of dielectric absorption, coupled with a low dissipation factor. These attributes directly correlate to lower dipole moment relaxation times and the inductive circuit limitations inherent to bipolar capacitor configurations. In addition, inductance limits the rise time of the high voltage pulse as the voltage flows through the conductive wire path connecting the high voltage DC pulse to the contained gaseous target to be ionized into an ionized plasma state.

While the combination of capacitor elements described above contribute to storing high levels of energy, the above elements also combine in limiting the rise time of the leading edge of the voltage discharge pulse occurring within the gaseous target. This limits the leading edge of the voltage discharge pulse rise time to be in the microsecond to millisecond range. This leading edge of the voltage discharge pulse rise time limitation significantly limits the efficiency of the overall method in generating electrons and positive ions in the plasma residing within the gaseous target.

U.S. Pat. No. 3,424,904—This patent describes a method for generating negative hydrogen ions from a proton source.

This method includes passing a beam of protons having relatively low energies in the range of up to about 2000 electron volts through atoms of a metal selected from the group consisting of cesium, rubidium, potassium, and sodium in order to produce a beam of particles comprising metastable and ground state hydrogen atoms and charged particles. The energy efficiencies of this method are severely limited by the upper electron volt limitation of the beam of protons. In addition, this energy limitation of the beam of protons significantly limits the thickness of the metal and thereby the quantity of ions generated per unit of time. This patent further discloses the use of magnetic fields. This patent does not describe any embodiment that does not use a magnetic field.

3. Discussion of Prior Art

In reviewing the prior art with respect to generating high energy free electrons from a pulsed plasma-based approach, no solution has been found within the prior art that can generate the volume of high energy free electrons desired per unit of time as described in this specification. In addition, significant constraints are imposed on the energy efficiencies of generating plasma using methods described in the prior art.

A review of the prior art reveals methods focusing on generating plasma using ionization by collision and/or thermal ionization techniques driving out electrons from the higher valence bands of gaseous molecules, rather than using bremsstrahlung photon energy to drive out electrons from the lower valence bands of gaseous molecules. The prior art methods lower overall electron and positive ion creation efficiencies by creating waste heat as a by-product of the methodologies previously applied in generating plasma. In addition, these approaches create plasma environments where large percentages of electrons and positive ions are loosely attracted to each other within the plasma, rather than being free to move into an external environment. In many of these situations the overall net charge of the plasma is neutral when viewed from the surrounding environment, rather than possessing nonequilibrium plasma characteristics.

In general the prior art describing the generation of plasma containing energetic electrons and positive ions is silent on the inefficiencies of the respective methods of plasma generation. These inefficiencies in turn directly correlate to low production rates per unit of time of free electrons or positive ions. One measure of an inefficient method is the volume of free electrons generated per unit of time in Joules divided by the amount of energy in Joules input into the initial plasma generating and plasma containment methodology. Another measure of an inefficient plasma generation method is the amount of heat generated in Joules divided by the amount of energy in Joules input into the initial plasma generating and plasma containment method.

In reviewing the prior art there are five elements, where one or more of these elements are combined into plasma creation apparatus designs resulting in low efficiency levels of free electron generation. Because of the inefficiencies induced by one or more of these methods, the creation of plasma is limited primarily to the vibrational or thermal excitation of electrons located within gaseous molecules surrounding the perimeter of the contained gas. The five elements discussed below limiting the generation of free electrons through the use of pulsed plasma techniques are the use of varying magnetic fields, alternating current (AC) or radio frequency (RF) input energy, apertures allowing the flow of gaseous molecules or plasma, spark discharges, and bipolar capacitor driven designs.

Inducing the creation of plasma within a volume of gas through the use of a varying pulse of energy imposed from the outer volume towards the center of the gas creates a "skin effect" resistance on the outer layers of the gas. This "skin effect" resistance is created by kinetic collisions between the induced magnetic pulse energy and the molecules, as well as kinetic collisions between the gaseous molecules. A significant portion of these kinetic collisions release energy in the form of heat. As the number of kinetic collisions of the gaseous molecules increases per unit of time, additional heat is created which continues to generate additional heat.

The number of gaseous molecule collisions per unit of time directly correlates to slowing down the front edge of a magnetic pulse as it continues to move towards the center of the volume of gas. This combined "skin effect" method, provides and additional contribution to decreasing the rise times of the leading edge of the magnetic pulse as it penetrates into the volume of gas. This decrease in the rise time of the leading edge of the magnetic pulse continues to lower the overall plasma generation efficiencies as the magnetic field penetrates further into the volume of gas. In parallel, the amount of waste heat being generated per unit area increases in direct proportion to the energy contained in the magnetic pulse as it penetrates further into the volume of gas.

In order to increase efficiencies in creating free electrons, a non-kinetic interaction with gaseous molecules is desired. One of the benefits of this approach is that it increases efficiencies in creating free electrons by not encountering inefficient heat generation methods. One of the early publications describing a method of applying photon energy in obtaining free slow-speed high energy electrons using primary, secondary and/or tertiary rays to strike gas molecules is described by in Phillip Von Lenard's Nobel acceptance speech on the discovery of Cathode Rays in 1906. Another publication by W. H. Bragg in 1907 describes similar results from using photon energy to create electrons. In the PPG apparatus, photons are used to drive a portion of these electrons out of the lower levels of gaseous molecular valence states in the form of slow speed electrons. This approach requires that the energetic photons created by the PPG apparatus having energy values greater than the ionization energies of the electrons residing in their respective valence shells of the gaseous molecules. However, there is an upper limitation to the photon energy. If the photon energy is too high, the photon will not remain near a gaseous molecule target long enough to force an electron out of the lower valence level of the gaseous molecule target.

When these valence shell electrons are driven out of a gas such as helium, a free electron and a positive ion are created without resorting to the use of kinetic collisions as the primary mechanism. This advantage in turn minimizes the amount of induced energy being lost in the form of heat being generated, thereby allowing a much higher percentage of the induced energy to be direct towards creating more free electrons and positive ions.

In comparison to the methods used by the PPG apparatus, the prior art describes the use of thermal or kinetic approaches that inherently limit electrons to being driven out of the highest valence states of gaseous molecules, rather than the lower valence states as done by the PPG method.

When the initial voltage pulse excitation uses AC or RF energy forced into a volume of gas to create plasma, the potential quantity of free electrons from the outer valence shell of molecules being generated at any point in time is limited by the pulse width of the oscillation input energy. Any generated free electrons, or free positive ions, must be drawn out of the plasma before the subsequent opposing charge portion of the AC or RF energy pulse enters into the plasma that restrains movement of the free electrons, or free positive ions. If only one polarity of the AC or RF pulse is used, then half of the energy used to create the initial waveform is wasted, thereby increasing the overall energy inefficiency of this type of method. When both polarities are used, the negative impact of the overall energy inefficiencies due to polarity reversals is increased. In addition, this approach negatively impacts the creation of nonequilibrium plasma.

Within the previous art, the use of apertures is described as a portion of the method to generate plasma. This method allows gaseous molecules to travel between chambers, or from within a chamber to an external environment. This method constrains the generation of plasma and the extraction of free electrons using the methods occurring within the PPG apparatus. One of the goals of the PPG apparatus design is for a bremsstrahlung photon to travel past as many gaseous molecules as possible. This goal requires that the gaseous molecules be constrained as much as possible. Sir Ernest Rutherford describes photographic experiments performed by C. T. R. Wilson depicting free electrons being generated by beta rays. Wilson indicated that the path of one beta ray would generate approximately 90 electrons from gaseous molecules before its energy level became too low to be effective. A. H. Compton and Sir J. J. Thompson reference a number of investigators that reported ranges electrons from 10 to several hundred being generated from gaseous molecules by an energetic photon. The highest numbers reported occurred with the use of cathode rays.

A subset of the prior art describes the use of spark discharges as a form of ejecting energy into a volume of gas to create plasma. This is another form of a low efficiency approach where only a small portion of the energy used in creating the spark is translated into plasma. The majority of the energy used in creating the spark flows between the electrodes and not into the volume of gas where the plasma is being created. The portion of the spark energy flowing into the volume of gas creates plasma primarily through inducing kinetic collisions of the gaseous molecules. As previously stated, this method in itself creates inefficiencies where a portion of this energy is transformed into heat rather than free electrons and free positive ions residing within plasma.

With respect to capacitors being employed in the previous art generating a pulse of energy into a volume of gas to create plasma, inductive limitations of traditional two plate bipolar capacitor designs limit the rise time of the leading edge of the voltage pulse. Prior art two plate bipolar capacitors function on current flowing through two conductive wires attached to two plates of the capacitor, where one lead is maintained at a higher potential than the conductive lead attached to a second plate of the capacitor. This approach builds a subsequent inductive constraint limiting the rise time of the leading edge of the voltage pulse when energy is released from a bipolar capacitor. This constraint is that a residual charge remains on each of the plates of the bipolar capacitor. This residual charge temporarily establishes a separate, yet interrelated opposing electric field spanning across the dielectric material located between the two plates of the bipolar capacitor. This electric field in turn induces its own slower electrical relaxation time function, which in turn couples into the electrical relaxation time of the dielectric material located between the two plates of the bipolar capacitor. The combined electrical relaxation times in turn limit the rise time of the leading edge of the released energy from the bipolar capacitor in the form of a voltage pulse to microseconds or greater.

The above limitation also occurs in earlier generation capacitors such as a Leyden jar design. When the single internal one pole (or plate) is charged, the other plate located on the outside of the Leyden jar is grounded. Current does not flow in this configuration when electrostatic energy is used to charge the Leyden jar capacitor. However, as the charge flows into the Leyden jar, an electrostatic field is established between the internal plate and the external grounded plate attracting an opposite charge to the grounded plate through the ground wire. The electrical relaxation time of the dielectric material contained between the two plates is constrained by the slower electrical relaxation time of the previously established electric field existing between the two opposing charge plates of the Leyden jar as discussed above.

4. Objects and Advantages

At a high level, the advantages of the PPG apparatus fall into four primary groups, each group building upon the quantity of high energy electrons created within previous stages of the PPG apparatus. The cumulative contribution of each advantage allows a pulsed flow of high energy free electrons flowing to the outer Faraday shield of the PPG providing a source of high voltage free electrons for use as a source of current and/or potential energy.

The first primary group of advantages of the PPG is the shape, material, mounting and location of the unipolar piezoelectric capacitor. An additional advantage includes the combination of the positive ions and electrons residing within the concentric nonequilibrium plasma cylinders residing within the first chamber of the PPG apparatus. The second primary group of advantages is the ability of the PPG to ionize a contained volume of gaseous atoms maintained in elevated metastable states within both chambers between each pulse. The third primary group of advantages is the cooler temperatures occurring through using bremsstrahlung radiation methods as the primary means of flooding energetic photons into a pressurized gas residing in the second chamber. This non-thermal approach focuses on driving slow speed high energy electrons out of the lower valence levels of the pressurized gas. This approaches overcome lower efficiency methods described in the prior art incorporating high temperatures and/or molecular vibrational techniques to drive electrons out of the upper valence levels of the gas molecules.

The fourth advantage is the PPG apparatus configuration allows the free slow-speed high energy electrons to be captured and moves to the outer shell of the PPG surrounding the first and second chambers through an electron transfer method described by the Faraday Effect.

The combination of the objects and advantages of my invention significantly increases the overall efficiency of generating pulsed plasma resulting in the creation of large quantities of free slow-speed high energy electrons, as compared to the low efficiency methodologies described in prior art plasma generation methods. A key advantage of my invention is that it overcomes significant inductive limiting effects hindering the generation of fast rise time high energy leading edge voltage pulses as compared to the prior art. Nikola Tesla described the correlation between fast rise time high energy leading edge voltage pulses and the creation of energetic bremsstrahlung photons. However his methods of generating these types of voltage pulses were limited by inductive constraints of the types of power transformers that he used to create voltage pulses for his bremsstrahlung photon experiments.

My invention overcomes these inductive limiting techniques by not using magnetic fields created and maintained by flowing currents of closed loop electricity in initial, or subsequent method steps as described in the prior art when generating plasma within the PPG apparatus. In addition, my invention's reduction of inductive limitations in creating plasma directly correlates with higher efficiencies in creating plasma within the PPG apparatus, as compared to the low plasma generation efficiencies described in the prior art.

The innovative design and mounting mechanism of the unipolar piezoelectric capacitor subcomponent located within the PPG apparatus significantly overcomes limitations of traditional bipolar capacitors in providing fast rise time, high energy voltage pulses. This advantage arises through an innovation in my invention using a high voltage/low current brush or corona discharge approach placing significant electrostatic/electric field strains on the dipole moments contained within the dielectric material. The electrostatic/electric field strains applied to the tip of the dielectric material flows towards the lower energy well maintained in the larger mass area of the dielectric material. Each dipole moment within the dielectric material of the unipolar piezoelectric capacitor accepts energy as a non-inductive form of retained energy. The level of retained energy represents the collective sum of all increased dipole strains residing within the dielectric mass. The rate of increase of the voltage potential of this retained energy over time slows until the voltage level of the retained energy rises to equal the voltage level being presented at the sharp point of the piezoelectric capacitor. A description of the non-inductive piezoelectric response of dielectric material within the presence of different levels of electrostatic/electric fields was described by Valasek and reported by Cady.

An interrelated key characteristic contributing to the fast rise time of the leading edge of the high voltage pulse occurring within the PPG apparatus is that the selected dielectric material of the unipolar piezoelectric capacitor possesses low levels of dielectric absorption and high levels of dissipation characteristics. High energy bi-polar storage capacitors described in the prior art tend to have very high energy density characteristics restraining a significant percentage of energy from quickly discharging in the discharge mode. The restrained energy characteristic of traditional bi-polar capacitors contributes to the slower electrical relaxation times exhibited by these types of capacitors. This slower electrical relaxation time of bi-polar capacitors excludes them from designs requiring high voltage leading edge pulse rise times of less than several hundred nanoseconds.

The unique wedge shape of my unipolar piezoelectric capacitor design also contributes to overcoming the dipole polarization design limitations of high voltage bipolar capacitors described in the prior art. Increasing the voltage potential within and surrounding my unipolar piezoelectric capacitor further enhances the strain magnification effect discussed above, thereby providing an additional contribution to the overall fast rise time characteristics of the subsequent leading edge of the high voltage pulse of electrons when they are released from the unipolar piezoelectric capacitor.

The design and method of using a holster to mount the unipolar piezoelectric capacitor within the PPG serves two purposes. The first purpose of the holster is to ensure that the tip of the unipolar piezoelectric capacitor remains stationary and pointed directly towards an interface plate mounted between the first and second chambers of the PPG. The second purpose of the holster is to provide an energized surface area that places an additional electrostatic/electric field strain on the polarized dipoles residing within the dielectric material of the unipolar piezoelectric capacitor. This electrostatic/electric field strain is provides an additional force component in speeding up the dipole moment electrical relaxation time within the unipolar piezoelectric capacitor when the charging voltage is withdrawn. This function in turn contributes to the desired effect of having a fast rise time of the leading edge of the high voltage pulse exiting the cathode of the unipolar piezoelectric capacitor towards the interface plate. The rise time leading edge of this voltage pulse is at least an order of magnitude greater that high voltage rise times observed when energy is released in traditional bipolar capacitors.

An additional related key characteristic of my unipolar piezoelectric capacitor is that the dielectric breakdown strength of the dielectric material is not a key concern with respect to the amount of energy stored in comparison to bipolar capacitors. The energy storage in the unipolar piezoelectric capacitor is primarily related to the dipole polarization characteristics, whereas the design of the bipolar capacitor is heavily dependent upon the dielectric breakdown strength as a key component in determining the limits of energy storage capacity.

The energy storage capacity of bipolar capacitors described in the prior art with respect to high levels of energy storage is also limited by the internal breakdown characteristics occurring between the positive and negative plates of the bipolar capacitor. This dielectric breakdown strength function in turn becomes one of the restraining factors on the electrical relaxation time of the bipolar capacitor, which directly contributes to the slower leading edge high voltage pulse rise times outputs observed in the prior art for high voltage bipolar capacitors.

Coupling the fast rise time high voltage energy pulse provided by the unipolar piezoelectric capacitor, strategically placed within the first chamber, significantly increases the efficiencies in the overall plasma generation methodology when compared to the prior art. The skin effect observed when a slow rise time voltage pulse begins to penetrate a gas is significantly reduced within the PPG apparatus. This occurs when the positive ions created within the first chamber plasma generation method are attracted to the negatively charged circular wall of the first chamber forming an outer cylinder of nonequilibrium positive plasma. This method allows the free electrons created within the first chamber plasma generation methodology to form along an inner cylindrical axis of the first chamber. This "outer cylinder" of nonequilibrium positive ion plasma attracts the electrons in the negative portion of the "inner cylinder". This "inner cylinder" in turn has a higher concentration of free electrons located towards the outer diameter of this "inner cylinder" and a lower concentration of electrons in the central axis area located between the tip of the unipolar capacitor and the interface plate located between the two chambers residing within the PPG. This configuration in turn allows a higher percentage of high energy fast moving pulsed electrons from the tip of the unipolar piezoelectric capacitor to move through the central axis of the "inner cylinder" towards the interface plate encountering a low percentage of collisions with gaseous molecules residing within the first chamber of the PPG.

An additional key object and advantage incorporated into my invention is the structure of the first chamber and interface plate contributes to transforming the energy of the energetic electrons into bremsstrahlung photons being projected into the second chamber of the PPG. The result of this advantage allows the creation of large quantities of slow-speed high energy free electrons flowing onto the outer Faraday shield of the apparatus. The advantage of this portion of my invention's methodology is that significantly higher levels of Joule energy in the form of slow-speed high energy free electrons are accumulated based on greater plasma generation efficiencies occurring within the PPG when compared to the methods described in the prior art.

When the capabilities discussed above are combined together within the sequence of steps performed within my invention, much cooler plasma temperatures occur within the metastable environments established in both chambers of my invention. These cooler plasma temperatures also contribute to my invention having much lower inductance resulting in a more efficient generation of plasma. This plasma in turn directly supports the generation of large quantities of free electron as compared to thermally oriented molecular vibration methods described in the prior art.

In comparison to prior art techniques, the advantages discussed above with respect to maintaining a vacuum in the first chamber and a pressure in the second chamber containing different types of gases, or gas mixtures, within their respective metastable environments could not be achieved if apertures were included in the PPG design. Apertures between the two chambers or to the outside of the PPG would not allow the different plasma effects discussed above to occur that are based on the different pressure/gas characteristics of each chamber.

An additional object of my invention is that multiple PPG units can be used in a sequential methodology where the slow-speed high energy free electrons collected on the outer Faraday shield of a first unit are used as the input to a second unit thereby increasing overall Joule energy levels of the slow-speed high energy free electrons being generated by the second unit to higher levels. This method of connecting the output of one PPG unit to the input of an additional PPG unit can be extended for as many PPG units as desired.

As discussed above, the design of the PPG apparatus focuses on releasing a pulse of fast voltage rise time energy in the form of energetic electrons from the unipolar piezoelectric capacitor to the interface plate rather than a spark discharge. The concept of using a brush, or corona, discharge to initially input energy into a unipolar piezoelectric capacitor design is unique when compared to the closed circuit current moving methods discussed in the prior art. This method of charging the unipolar piezoelectric capacitor, versus a spark discharge, provides much greater efficiencies in the amount of energy stored in the unipolar piezoelectric capacitor per unit of time versus using a spark discharge method. There is no grounding plate on the unipolar piezoelectric capacitor like there would be in a bipolar capacitor design. In a spark discharge event, the additional energy used in creating the spark discharge event is introduced into the overall creation of plasma methodology as unused heat, which in turn creates additional non-value impacts that further reduce free electron generation efficiencies.

SUMMARY

The unique combination of the PPG innovative apparatus elements and method of bremsstrahlung photon generation provides a source of slow-speed high energy free electrons, or positive ions, created by using non-equilibrium, non-thermal, pulsed plasma techniques in a metastable environment. These innovative apparatus elements include a unipolar piezoelectric capacitor design providing fast rise time voltage pulses of less than several hundred nanoseconds. The combination of the PPG apparatus elements with a stepped sequence of pulsed plasma creation creates a large quantity of slow-speed high energy free electrons for subsequent processing in providing electricity or driving motors.

DRAWINGS

List of Figures

Figure 4:
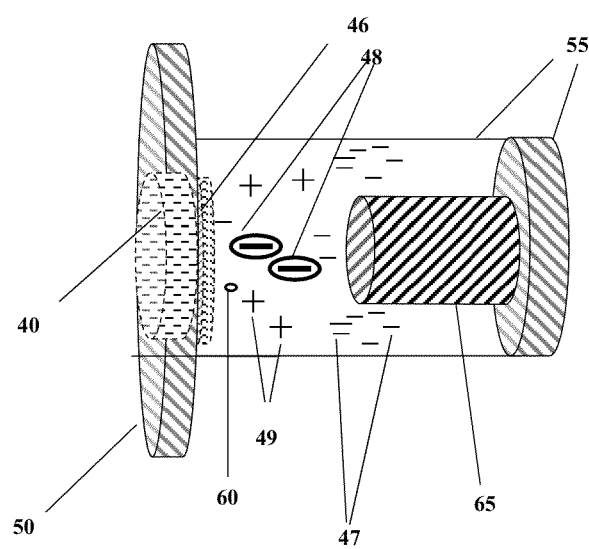
Figure 5:
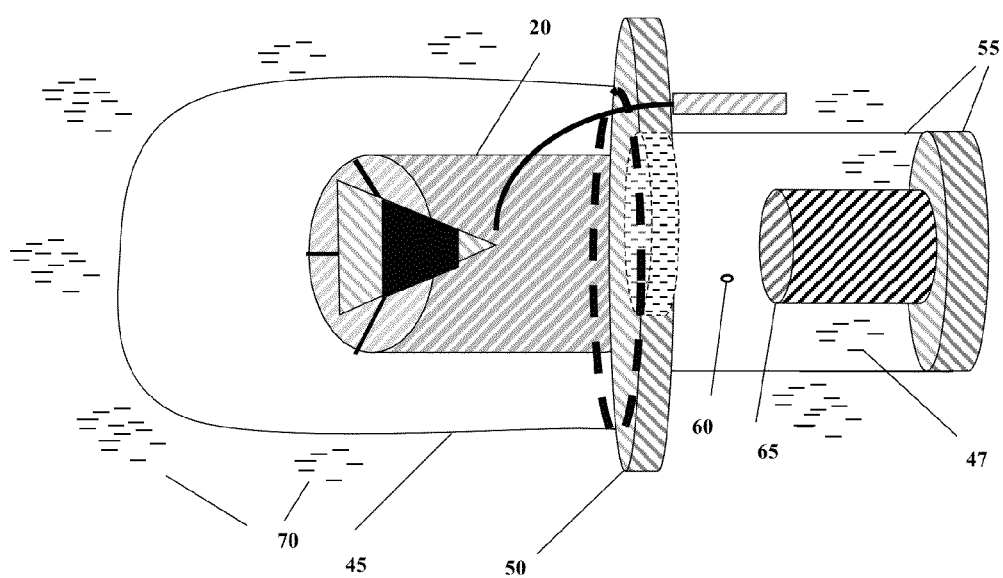

FIG. 1—Top-level view of PPG apparatus
FIG. 2—Unipolar piezoelectric capacitor (construction and assembly 2A through 2D)
FIG. 3—Plasma generation during sequence steps $\tau 1$ and $\tau 2$
FIG. 4—Plasma generation during sequence steps $\tau 3$ and $\tau 4$
FIG. 5—Slow-Speed High Energy Free Electron capture and distribution during time period $\tau 5$

DRAWINGS - LIST OF REFERENCE NUMERALS

10—Voltage Multiplier
15—Conductor
20—First Chamber
23—Piezoelectric Disc
25—Piezoelectric Disc Cylinder
30—Unipolar Piezoelectric Capacitor
33—Conductive Holster
34—Mounting Bar
36—Holster/Capacitor Assembly
37—Low-Pressure Gas
40—Interface Plate
41—First Plasma Electrons
42—First Plasma Positive Ions
43—High Energy Fast Moving Electrons
44—First Chamber Electrons
45—Outer Faraday Shield
46—Alpha Particle Barrier
47—Slow-Speed High Energy Free electrons (inside Second Chamber (55))
48—Plurality of Energetic Bremsstrahlung Photons
49—Positive ions in the second chamber
50—Outer Faraday Shield Mounting Plate
55—Second Chamber
60—High-Pressure Gas
65—Collection Cylinder
70—PPG Slow-Speed High Energy free electrons (Outside surface of Outer Faraday Shield Mounting Plate (50))

DETAILED DESCRIPTION

FIG. 1 Through FIG. 5—Preferred Embodiment

The preferred embodiment of the PPG invention is to generate slow-speed high energy free electrons. Alternative embodiments include generating a source of high energy positive ions.

In FIG. 1 a voltage multiplier (10) is connected to one end of a conductor (15). Conductor (15) is inserted through an outer Faraday shield mounting plate (50) and into a first chamber (20). In FIG. 3 a tip of the conductor (15) is pointed directly towards one end a unipolar piezoelectric capacitor (30), this end being in the shape of a sharp point. A gap distance exists between the tip of the conductor (15) and the sharp point of a unipolar piezoelectric capacitor (30) where this gap distance allows an optimal flow of electrons from the tip of the conductor (15) and the sharp point of the unipolar piezoelectric capacitor (30) in the form of a brush or corona discharge when the voltage multiplier (10) is energized.

FIG. 2 provides a depiction of the unipolar piezoelectric capacitor (30) construction and mounting method. In FIG. 2A, a number of piezoelectric discs (23) are attached to each other using a conductive adhesive forming a piezoelectric disc cylinder (25) as shown in FIG. 2B. The poling configuration of each piezoelectric disc (23) is such that the positive side of one piezoelectric disc (23) is adhered to the negative side of the next piezoelectric disc adhered to the first piezoelectric disc (23).

The material characteristics of the piezoelectric disc (23) exhibit characteristics including a high relative dielectric constant (or high relative permittivity) and polarization characteristics. Additional characteristics include a high dissipation factor, allowing fast dipole depolarization decay times sufficient to provide nanosecond to microsecond level voltage pulses at the tip of the unipolar piezoelectric capacitor (30). A companion dielectric material characteristic is that the unipolar piezoelectric capacitor (30) exhibits low levels of dielectric absorption providing the ability to retain stored energy. This capability in turn contributes to the fast dipole depolarization decay times of the dielectric material.

The piezoelectric disc cylinder is subsequently milled into the shape of a wedge with a sharp point (FIG. 2C). The wedge shaped unipolar piezoelectric capacitor (30) is then inserted within the conductive holster (33). Mounting bars (34) are attached to the conductive holster (33) forming a holster/capacitor assembly (36) as depicted in FIGS. 2C and 2D. The complete assembly is inserted and attached to the inside of the first chamber (20) as depicted in FIG. 3.

The material characteristics of the conductive holster (33) allow a portion of the electrons flowing into the unipolar piezoelectric capacitor (30) from the brush, or corona discharge to also flow onto the surface of the conductive holster (33).

The material characteristics of each mounting bar (34) are similar to the conductive holster (33). These material characteristics allow the flow of a portion of the electrons residing on the conductive holster (33) to move to the outer wall of the first chamber (20) and perform as the first chamber electrons (44) as shown in FIG. 3.

In FIG. 3 it is shown that the unipolar piezoelectric capacitor (30) is held in a fixed position within the holster/capacitor assembly (36) where the sharp point of the unipolar piezoelectric capacitor (30) resides within a volume of a low-pressure gas (37). A key characteristic of the low-pressure gas (37) is that it exhibits a low electron recombination rate within a metastable environment established within the low pressure gas (37) contained within the first chamber (20) immediately after a pulsed plasma event has occurred. A low electron recombination rate of the low-pressure gas (37) directly corresponds with an increased amount of time that the molecules of the low-pressure gas (37) remain in an energized metastable state after a pulsed plasma creation event has occurred. Additional characteristics include low levels of electron affinity, and a large mean free path of the low-pressure gas (37) molecules.

The optimal placement position of the sharp point of the unipolar piezoelectric capacitor (30) within the volume of the low-pressure gas (37) allows high levels of energy efficiency when each pulsed plasma generation event occurs within the first chamber (20). This placement allows energy pulses flowing out of the sharp point of the unipolar piezoelectric capacitor (30) to flow from a higher energy potential in the center of the low-pressure gas outwards to lower energy potentials of the low-pressure gas (37) located within the first chamber (20).

The sharp point of the unipolar piezoelectric capacitor (30) is also pointed directly at an interface plate (40) mounted inside of the outer Faraday shield mounting plate (50). The outside diameter of the interface plate (40) being slightly smaller than the inside diameter of the first chamber (20). The material and shape of the interface plate (40) is such that it receives energetic electrons across a high percentage of the interface plate surface area directed towards it from the tip of the unipolar piezoelectric capacitor (30). This allows the plurality of energetic bremsstrahlung photons (48) to flow into the second chamber (55) (FIG. 4), resulting from a bremsstrahlung emission event occurring as the high energy fast moving electrons (43) impact the interface plate (40) within the first chamber (20). The plurality of energetic bremsstrahlung photons (48) flowing into the second chamber (55) from the bremsstrahlung emission event occurring within the interface plate (40) creates a second pulsed plasma event within a high-pressure gas (60) residing within the second chamber (55).

The side of the interface plate (40) facing into the second chamber (55) is coated with materials exhibiting electropositive characteristics to increase the amounts of the plurality of energetic bremsstrahlung photons (48) being emitted from interface plate (40). The more effective types of these materials include the alkali metals such as cesium or thorium. In addition, an alpha particle barrier (46) can be incorporated onto the side of the interface plate (40) facing into the second chamber (55) to capture alpha particles flowing into the second chamber when they occur. These alpha particles are generated as a byproduct of the bremsstrahlung emission methodology and are not desired when a free electron generation methodology is desired because the alpha particles will combine with a portion of the free electrons residing within the second chamber (55), thereby neutralizing nearby free electron. This type event will lower the overall efficiency of generating PPG slow-speed high energy free electrons.

The material and shape characteristics of the interface plate (40), as well as the mounting characteristics of the interface plate (40) to the first chamber (20) and the outer Faraday shield mounting plate (50), also allow the interface plate (40) to perform the function of a pressure bulkhead. This pressure bulkhead function maintains the low-pressure gas (37) residing in the first chamber (20) as shown in FIG. 3, as well as maintaining a high-pressure gas residing in the second chamber (55) during all pulsed plasma generated events.

One key characteristic of the high-pressure gas (60), shown in FIG. 4, residing within the second chamber (55), is that the molecules of the high-pressure gas (60) exhibit enhanced levels of losing electrons from their lower valence levels. This ability of the molecules comprising the high-pressure gas (60) directly correlates to the electropositive characteristics of the high-pressure gas (60). An additional characteristic of the high-pressure gas (60) is that it exhibits a low electron recombination rate immediately after a pulsed plasma event has occurred. The lower the electron recombination rate of the high-pressure gas (60) corresponds with an increased amount of time that the molecules of the high-pressure gas (60) remain in an energized metastable state after a pulsed plasma creation event has occurred.

The material characteristics of a collection cylinder (65) residing within, and connected to the second chamber (55), as well as the material characteristics of the wall of the second chamber (55), allow the collection of the slow-speed high energy free electrons (47) generated by the emission of the plurality of energetic bremsstrahlung photons (48) within the second chamber (55). These slow-speed high energy free electrons (47) coming from molecules of the high pressure gas (65) residing within the second chamber (55) then flow onto the outer Faraday shield mounting plate (50), shown in FIG. 5, and then onto an outer Faraday shield (45) where they become PPG slow-speed high energy free electrons (70).

The shape, material and size of the outer Faraday shield (45) and the second chamber (55) are constructed to allow the free electron energy in Joules per unit area occurring at any point on the outer Faraday shield to be less than the free electron energy in Joules per unit area on either the collection cylinder (65), or the wall of the second chamber (55).

Operation of Invention

FIG. 1, 3-5

The preferred embodiment of the PPG apparatus is to generate a source of high energy electrons (>1 Joule) represented as PPG slow-speed high energy free electrons (70) residing on the surface of the outer Faraday shield (45) as shown in FIG. 5. The apparatus follows a five step sequence in generating a source of high energy electrons. The methods of drawing off these high energy free-electrons from the outer Faraday shield (45) provide a source of current and/or potential energy for use by external loads using either conductive or brush/spark discharge methods directed at a lower electrostatic/electric field potential.

In the following paragraphs, the sequence of steps will be discussed that occur within the PPG apparatus over time. Each sequence step will be represented by the designation ($\tau X$) where X is a numerical number representing the step where specific events are being performed within each sequence step discussion. A brief high-level summary view of the overall sequence of steps is discussed in the following two paragraphs. The detailed discussion of the events occurring within each step of the five step sequence follows the presentation of the high-level view.

The high level sequence of steps performed within the PPG apparatus begins at $\tau 1$ (FIG. 3) the voltage multiplier (10) is energized. At $\tau 2$ the voltage multiplier (10) remains energized and the unipolar piezoelectric capacitor (30) accumulates and increasing store of retained energy via electrons provided from a brush or corona discharge. A portion of the energy from the brush, or corona discharge, also contributes to establishing the initial portions of a first non-equilibrium plasma is created in the first chamber (20). In addition, a portion of the electrons charging the unipolar piezoelectric capacitor flow onto the outer surface of the first chamber (20). These electrons are depicted as the first chamber electrons (44) in FIG. 3.

At $\tau 3$ the voltage multiplier (10) ceases providing energy into the first chamber (20), thereby allowing the energy stored in the unipolar piezoelectric capacitor to be released into the first chamber (20) in the form of high energy fast moving electrons (43). These high energy fast moving electrons (43) move through the first non-equilibrium plasma and strike a high percentage of the surface area of the interface plate (40) facing towards the unipolar piezoelectric capacitor. At $\tau 4$ (FIG. 4) the high voltage pulse of energy strikes the interface plate (40) creating bremsstrahlung events to occur within the interface plate (40) thereby driving energetic photons (48) into the second chamber (55). These events in turn drive a plurality of slow-speed high energy free electrons (47) out of the high pressure gas (60) as part of a second non-equilibrium plasma generation methodology occurring within the second chamber (55). At $\tau 5$ (FIG. 5) the slow-speed high energy free electrons (47) residing within the second chamber (55) migrate to the outside of the outer Faraday shield (45) becoming the PPG slow-speed high energy free electrons (70) as shown in FIG. 5.

Once all five sequence of steps are completed based on the first pulse of energy, the cycle is repeated with a second pulse from the voltage multiplier (10) and the five sequence of steps are performed again starting with the first step of the sequence. These cycles of pulses continue as long as the need for supplying high potential PPG slow-speed high energy free electrons (70) from the PPG is required to meet external power consumption requirements.

From a detail sequence of steps perspective, FIG. 3 depicts high voltage electrons provided through a voltage multiplier (10), such as a Cockcroft Walton circuit, initiating the first step within $\tau 1$ of the PPG electron generation methodology. Electrons flow through conductor (15) and then out of the tip of conductor (15) towards the tip of the unipolar piezoelectric capacitor (30). The negative electrostatic/electric field potential on the tip of the conductor (15) located inside of the first chamber (20), is higher than the potential located on the on the tip of the unipolar piezoelectric capacitor (30) located close to the tip of conductor (15). During both the $\tau 1$ and $\tau 2$ time periods, the tip of the conductor (15) performs as a first cathode ejecting electrons and the tip of the unipolar piezoelectric capacitor (30) performs as a first anode in receiving portions of the electron energy from the first cathode.

Referencing FIG. 3 and FIG. 4 in describing the events occurring during the $\tau 2$ and $\tau 3$ sequence of steps, the higher-level potential energy of electrons located at the tip of the conductor (15) are drawn to the tip of the unipolar piezoelectric capacitor (30) in the form of a brush or corona discharge. During $\tau 2$, the energy levels at the tip of the unipolar piezoelectric capacitor (30) are at lower levels than the energy levels of the brush or corona discharge. During $\tau 2$ the orientation of the dipoles contained within the piezoelectric lattice of the unipolar piezoelectric capacitor (30) reside at lower electron energy levels per unit area than the electron energy flowing to the tip of the unipolar piezoelectric capacitor (30). This approach applies energy potentials, rather than traditional current flow techniques to "charge" the unipolar piezoelectric capacitor (30) with electrostatic/electric field energy.

The energy of the electrons received at the tip of the unipolar piezoelectric capacitor (30) during the $\tau 2$ step is disbursed into the dielectric material of the unipolar piezoelectric capacitor (30) through a deionization by diffusion methodology. The higher energy levels flow out from the higher potential energy field gradients to lower energy field gradients of the dielectric material allowed within the larger area of the base portion of the wedge shape of the unipolar piezoelectric capacitor (30). Energy is captured and stored within this step is in the form of placing polarized strains on the dipole moments of the unipolar piezoelectric capacitor (30) dielectric material. The wedge shape of the unipolar piezoelectric capacitor (30) further enhances this effect of allowing the higher energy capacity to fan out from the narrower end of the wedge into the broader area and lower energy levels of the dielectric material located within the larger base area of the wedge. The collective energy captured by the polarized strains on the dipole moments located in the larger areas the wedge continues to rise until it is equal to the energy to the level of energy being received at the tip of the unipolar piezoelectric capacitor (30).

Three additional events occur during the $\tau 2$ step. The first event is that portions of the electrons being emitted from the tip of conductor (15) flow onto the surface of the conductive holster (33). The negative electrostatic/electric field residing on the conductive holster (33) increases the strain imposed on the internal electric dipole moments residing within the unipolar piezoelectric capacitor (30). This increase in the strain on the electric dipole moments magnifies the potential energy strain being placed on dipole moments contained within the wedge by an amount that is a function of the polarizability of the piezoelectric material, the method of manufacture/poling of the base piezoelectric material, and the electric field imposed on the unipolar piezoelectric capacitor (30).

The second additional event occur during the $\tau 2$ step is that a portion of the higher level potential energy of electrons flowing from the tip of the conductor (15) create the first portion of a nonequilibrium first plasma metastable state within the first chamber (20). This first nonequilibrium metastable plasma state is created within the low-pressure gas and is represented by the first plasma electrons (41) and first plasma positive ions (42) in FIG. 3. The rise in energy levels of this first plasma is based on the rate of energy not being captured by the unipolar piezoelectric capacitor (30). The rate of free electrons flowing into the low-pressure gas (40) increases as the unipolar piezoelectric capacitor (30) approaches an equilibrium state in accepting energy. This event thereby further increases the energy level of the first plasma state. This first plasma state places the molecules of the low-pressure gas (40) into a metastable state in preparation for the next sequence of events occurring in the τ3 step.

The third additional event occurring during the τ2 step is that multiple concentric cylinders of oppositely charged nonequilibrium plasma are formed within the first chamber (20). These multiple concentric cylinders surround a central axis formed between the tip of the unipolar piezoelectric capacitor (30) and the side of the interface plate (40) facing into the first chamber (20).

The method of forming of these concentric cylinders begins when a portion of the electrons flowing onto the surface of the conductive holster (33) continue flowing along the mounting bar (34) of the conductive holster (33), and then on to the wall of the first chamber (20). These electrons are represented as the first chamber electrons (44) in FIG. 3. This flow of the first chamber electrons (44) occurs when the wall of the first chamber (20) is at a lower energy potential than the conductive holster (33). As these first chamber electrons (44) surround the wall of the first chamber (20) they attract the previously created first plasma positive ions (42) residing within first chamber (20). This concentration of the first plasma positive ions (42) forms a non-equilibrium positive plasma cylinder close to the inside surface of first chamber (20). The non-equilibrium positive plasma cylinder gathering near the inside surface of first chamber (20) attracts a percentage of the first plasma electrons (41) that form a second concentric inner cylinder of non-equilibrium negative plasma. This action in turn opens up a central cylinder of space concentric to the central axis within first chamber (20) containing low concentrations of first plasma electrons (41), first plasma positive ions (42), and molecules of the low-pressure gas (37). The focus of the axis of this central cylinder is located directly between the tip of the unipolar piezoelectric capacitor (30) and the interface plate (40).

During the τ3 step, the voltage multiplier (10) ceases providing a pulse of high voltage electrons through a brush or corona discharge. Also, during the τ3 step, the roles of the tip of the unipolar piezoelectric capacitor (30) and the interface plate (40) are reversed. The tip of the unipolar piezoelectric capacitor (30) changes from performing as a first anode in the previous steps to now performing as a second cathode. The side of the interface plate (40) facing into the first chamber (20) begins performing as a second anode. The high levels of retained energy stored within the unipolar piezoelectric capacitor (30) will immediately, and rapidly be released to flow to the tip of the unipolar piezoelectric capacitor (30) as the internal dipole moments of the dielectric material relax, thereby releasing their combined levels of retained energy. This energy is then released into the central cylinder of space previously formed within first chamber (20) in the form of a high voltage pulse where the leading edge of this pulse is in the form of a fast high voltage rise time of less than several hundred nanoseconds. This high voltage pulse contains high energy fast moving electrons (43) that move towards the interface plate (40).

A portion of the high energy fast moving electrons (43) strike portions of the low concentration low-pressure gas (40) molecules, first plasma electrons (41) and first plasma positive ions (42) residing in a metastable state within the central cylinder elevating them into higher-level metastable energy states within the low pressure gas (40). The remaining high energy fast moving electrons (43), as well as additional high energy first plasma electrons (41) created by kinetic collisions within the gas molecules located in the first chamber (20), rapidly move towards the interface plate (40). The percentage of these high energy first plasma electrons (41) striking a high percentage of the surface area of the interface plate (40) is significantly increased as they travel through the central axis of the central cylinder of the nonequilibrium plasma located within the first chamber (20) containing low volumes of gas molecules.

During the τ4 step the primary events occurring with respect to the internal portions of the interface plate (40) are bremsstrahlung events occurring that result in the creation of energetic bremsstrahlung photons (48). These energetic bremsstrahlung photons (48) are ejected from the side of the interface plate (40) that performs as a third cathode during the τ4 step. These energetic bremsstrahlung photons (48) are projected into the high-pressure gas (60) residing within the second chamber (55).

The creation of the energetic bremsstrahlung photons (48) within the interface plate (40) occurs based on the high energy fast moving electrons (43) striking a high percentage of the surface area of the interface plate (40) facing the first chamber (20). As these high energy fast moving electrons (43) penetrate the interface plate (40, a plurality of energetic bremsstrahlung photons (48) are driven into the second chamber (55) (FIG. 4.). The bremsstrahlung production of the plurality of energetic photons (48) continues until the high energy fast moving electrons (43) have ceased flowing out of the tip of unipolar piezoelectric capacitor (30) at the conclusion of the τ3 step.

During the τ4 step as a plurality of energetic bremsstrahlung photons (48) interact with the molecules residing within the high-pressure gas (60) in second chamber (55), a cumulative ionization effect begins occurring. This cumulative ionization effect occurs as the energetic bremsstrahlung photons (48) knock out electrons residing in the lower valence shells of the high-pressure gas (60) molecules, either directly or indirectly from primary, secondary and/or tertiary rays as described by P. E. Von Lenard and W. H. Bragg. C. T. R Wilson developed cloud chamber techniques to photograph this ionization event. A range of these photographs were used by a number of researchers in their independent investigations to determine that up to several hundred free electrons can be created by one energetic bremsstrahlung photon as it traverses through a molecular gas residing within the cloud chamber.

The cumulative ionization event described above creates a plurality of slow-speed high energy free electrons (47) and a plurality of positive ions (49) in the second chamber (55). The release of the slow-speed high energy free electrons (47) occurs when the energetic bremsstrahlung photons (48) influence the nuclear restraining forces within the valence bands of the atoms of the high-pressure gas (60), thereby releasing the lower level valence electrons residing within the gaseous molecules that each energetic bremsstrahlung photon (48) influences. Due to the low rate of molecular recombination within the metastable gas residing in the second chamber (49), only a portion of the slow-speed high energy free electrons created in the second chamber (47) recombine with the positive ions in the second chamber (49) before they are captured by the collection cylinder (65). The low rate of molecular recombination method allows a portion of the slow-speed high energy electrons that are not captured by the collection cylinder (65) to form a temporary metastable plasma state waiting for the next pulse of energetic bremsstrahlung photons (48) to be received from the interface plate (40).

During the τ5 step (ref FIG. 5), a portion of the slow-speed high energy free electrons (47) located in the second chamber (55) created during the τ4 step are attracted to the collection cylinder (65) as it performs its function as a lower energy level third anode. The slow-speed high energy free electrons (47) collected in the τ5 step move to the outside of second chamber (55) and flow out through the outer Faraday shield mounting plate (50) and onto the outer Faraday shield (45) depicted as a plurality of PPG slow-speed high energy free electrons (70) in FIG. 5. At this point, portions of the PPG slow-speed high energy free electrons (70) are drawn off the outer Faraday shield (45) for use as a source of current and/or a potential to drive external loads. As the PPG slow-speed high energy free electrons (70) are extracted from the outer Faraday shield (45), additional slow-speed high energy free electrons in the second chamber (47) flow onto the outer Faraday shield (45) from the collection cylinder (65) becoming PPG slow-speed high energy free electrons (70).

A new cycle of the overall PPG apparatus electron generation sequence of steps restarts at τ1 with a new pulse of energy from the voltage multiplier (10). However, after the initial pulse from the voltage multiplier (10) has cycled through the initial sequence, the molecules of the gas/gas mixtures in first chamber (20) and second chamber (55) remain in elevated metastable energy states as a byproduct of the events occurring in the τ2 and τ4 steps of the previous five step sequence. The presence of these elevated metastable energy states further contributes to increasing overall efficiencies in generating slow-speed high energy free electrons in subsequent five step sequences by slowing the recombination rate of free electrons and positive ions. Therefore a portion of the timing calculation used in determining the generation of the second and subsequent energy pulses from the electrostatic potential generator (10) occurs at pulse frequencies that take advantage of the molecules in the first chamber (20) and the second chamber (55) while they reside in their respective metastable states.

Alternative Embodiments—FIG. 1-5

One alternative embodiment is that multiple PPG units can be linked together in stages where the second and subsequent stages use the source of PPG slow-speed high energy free electrons (70) from the previous PPG stage in lieu of a voltage multiplier (10) as the energy input device. This alternative embodiment requires the use of a high voltage switch with interconnected timing and energy level sensing devices to the second and subsequent PPG stages. These switches and interconnected timing and energy level sensing devices provide the desired sequence and timing of subsequent high voltage pulses to efficiently generate additional quantities of PPG slow-speed high energy free electrons (70) per unit of time.

A second alternative embodiment is to create PPG positive ions residing on the surface of the outer Faraday shield (45). One method to perform this second alternative is to change the material composition of the interface plate (40) and/or the characteristics of the high-pressure gas (60) residing within the second chamber (55) allowing a plurality of nonequilibrium positive ions to be created in the second chamber (49). Portions of these positive ions subsequently flow onto the outer Faraday shield (45) rather than slow-speed high energy free electrons (70).

CONCLUSION, RAMIFICATIONS, AND SCOPE

Thus, the reader will see that the synergistic combination of the PPG innovative apparatus elements, methods, and sequence of steps allows a source of slow-speed high energy free electrons to be created using non-equilibrium, non-thermal, pulsed plasma techniques in a manner that has not previously been described in its entirety within the prior art. Although the description above contains many specificities, these should not be construed as limiting the scope of the invention, but as merely providing illustrations of some of the presently preferred embodiments of this invention. For example, the unipolar piezoelectric capacitor can have many types of different configurations; even non-piezoelectric, as long as the energy level containment and subsequent fast rise time high voltage pulse effect is allowed to occur. Another example is that many different configurations of gases/gas mixtures can be used in either chamber providing quantities of PPG slow-speed high energy free electrons (70) on the outer conductive shell of the PPG.

Thus the scope of the invention should be determined by the appended claims and their legal equivalents, rather than by the examples given.

What is claimed is:

1. An apparatus for creating a plurality of free slow-speed high energy electrons providing a source means of current and/or potential energy for use by external loads, comprising,
    (a) a means to project a pulse of electrostatic/electric field energy into a first chamber,
    (b) a dielectric material providing a capture means of said pulse of electrostatic/electric field energy, and a release means in the form of a plurality of high energy electrons,
    (c) an interface plate with a means to receive said plurality of high energy electrons, whereby said interface plate is located between said first chamber and a second chamber,
    (d) said interface plate having a means to create an emission of a plurality of energetic bremsstrahlung photons into said second chamber when struck by said plurality of high energy electrons, moving through said first chamber,
    (e) said plurality of energetic bremsstrahlung photons bombarding a plurality of gaseous molecules residing within said second chamber having a means to force a plurality of free slow-speed high energy electrons out of the molecular valence levels of said plurality of gaseous molecules,
    (f) an outer shield encapsulating said first chamber and said second chamber, having a connective means allowing said plurality of free slow-speed high energy electrons to flow by a Faraday Effect onto an outer shield encapsulating said first chamber and said second chamber whereby said plurality of free slow-speed high energy electrons are provided for said source means of current and/or a potential for use by external loads.

2. An apparatus that creates a plurality of free slow-speed high energy electrons providing a source means of current and/or potential energy for use by external loads, comprising,
    (a) a pulsed electrostatic/electric field energy driven source means having a voltage multiplier means and a conductor means, where a tip of said conductor resides within a first chamber,
    (b) said tip of said conductor providing a means of supplying said pulsed electrostatic/electric field energy into said first chamber in the form of a brush or corona discharge means,
    (c) said brush or corona discharge directed towards a dielectric material having a retained energy means to receive and store said pulsed electrostatic/electric field energy and a means to release said stored pulsed electrostatic/electric field energy in the form of a plurality of fast moving high energy electrons having a fast leading edge voltage rise time means, (d) said plurality of fast moving high energy electrons having a means to project through a first gas, or first gas mixture, towards an interface plate, (e) said interface plate having a means to emit a plurality of energetic bremsstrahlung photons into a second chamber when struck by said fast moving high energy electrons moving through said first chamber, (f) said plurality of energetic bremsstrahlung photons having a means to force a plurality of free slow-speed high energy electrons out of the molecular valence levels of a second gas, or gas mixture, residing within said second chamber, (g) said second chamber having an electron collection means and a subsequent electron distribution means allowing said plurality of free slow-speed high energy electrons to flow onto the outer surface of an outer shield encapsulating said first chamber and said second chamber, whereby said plurality of free slow-speed high energy electrons are provided for said source means of current and/or potential energy for use by external loads.

3. Elements of claim 2 wherein said dielectric material having a wedge shape means and a mounting means within a holster, said holster having a first connecting means with the inside wall of said first chamber wherein:

(a) said dielectric material is comprised of one or more layers formed into the shape of a cylinder means, (b) said cylinder means is formed into said wedge shape means having a sharp point means located on one vertex of said wedge shape means, (c) when said cylinder means is comprised of multiple discs of said dielectric material, each disc is joined together by an adhesive means, (d) said wedge shape having a means to be mounted within said holster wherein said sharp point is directed towards said interface plate located between said first chamber and said second chamber.

4. Elements of claim 2 and wherein said dielectric material is comprised of high levels of permittivity, dielectric constant, dissipation factor, polarization, and low levels of dielectric absorption providing a means for a displacement of ionic charges to occur in the presence of said brush or corona discharge, thereby enhancing the capacity of said retained energy means to receive and store said pulsed electrostatic/electric field energy from said brush or corona discharge, wherein each said disc having a means to be formed within a static electric or magnetic field when initially being formed into a disc shape using said dielectric material.

5. Elements of claim 2, or claim 3 whereby said wedge shape having said sharp point and said dielectric material providing a means to allow a fast depolarization decay time when said retained energy is released, when said pulses from said pulsed electrostatic/electric field energy driven source cease, thereby providing a means for urging said retained energy to be released from said tip of said wedge in the form of said plurality of fast moving high energy electrons, (a) said plurality of fast moving high energy electrons possessing a voltage rise time means of less than several hundred nanoseconds emitted from said sharp point of said wedge shape towards said interface plate.

6. Elements of claim 2 where said first gas, or first gas mixture, residing within said first chamber is maintained in a vacuum thereby minimizing collisions of said plurality of high energy electrons as they pass through a first gas, or first gas mixture towards said interface plate.

7. Elements of claim 2 where said second gas, or second gas mixture, residing within said second chamber is maintained under a pressure thereby increasing the number of molecules of said second gas, or second gas mixture, to interact with said plurality of energetic bremsstrahlung photons.

8. Elements of claim 2 where said interface plate having a mounting means between said first chamber and said second chamber and said interface plate having a material composition means, a material thickness means, and a diameter means allowing said plurality of energetic bremsstrahlung photons to be emitted from said interface plate into said second chamber when struck by said plurality of fast moving high energy electrons emitted from said sharp point of said wedge shape wherein said interface plate comprising, (a) said mounting means of said interface plate allowing said vacuum of said first gas, or first gas mixture, to be maintained in said first chamber and said pressure of said second gas, or second gas mixture, to be maintained in said second chamber, (b) said material thickness means and said material composition means creating a bremsstrahlung radiation means to occur within said interface plate, thereby providing a means for said plurality of energetic bremsstrahlung photons to be emitted from said interface plate into said second chamber, as a result of said plurality of high energy electrons moving through said first chamber and striking said interface plate, (c) Said diameter of said interface plate being slightly smaller than the inner diameter of said first chamber thereby allowing the maximum amount of said plurality of energetic bremsstrahlung photons to be emitted from said interface plate into said second chamber, (d) Said interface plate facing into said second chamber having a barrier to minimize alpha particles created as part of said bremsstrahlung radiation event flowing into said second chamber.

9. Elements of claim 2 or claim 7 where said molecules of said second gas, or gas mixture having an electropositive characteristic means providing a low rate of electron recombination over time when ionized by a high energy electrostatic/electric fields means created within said second chamber as a result of said energetic bremsstrahlung photons emitting from said interface plate.

10. Elements of claim 2, or claim 7, or claim 9 wherein said molecules release said plurality of free slow-speed high energy electrons from said molecular valence levels of said second gas, or second gas mixture, based on an electron release interaction means with said plurality of energetic bremsstrahlung photons.

11. Elements of claim 2 wherein said second chamber containing said electron collection means having a second connecting means to the inside of said second chamber.

12. Elements of claim 2 where said outer shield encapsulating said first chamber and said second chamber having a third connecting means allowing a flow of said plurality of free slow-speed high energy electrons from said second chamber onto said outer shield.

13. Elements of claims 2, or 3, or 8 where a means for generating said plurality of free slow-speed high energy electrons further comprising, (a) said voltage multiplier means initiating a means of supplying a high voltage pulse of energy from said pulsed electrostatic/electric field energy driven source through said tip of said conductor into said first chamber, where said tip of said conductor functions as a first cathode means, (b) said high voltage pulse of energy creates said brush or corona discharge containing a plurality of electrons means provided from said tip of said conductor directed towards said dielectric material, (c) said sharp point of said dielectric material performing as a first anode means in collecting said electrostatic/ electric field energy from said plurality of electrons, (d) said high voltage pulse of energy creates a nonequilibrium ionized plasma means within said gas or-gas-mixture residing within said first chamber, (e) said electrostatic/electric field energy collected by said sharp point of said dielectric material flows into said retained energy means of said dielectric material, (f) a portion of said plurality of electrons having a means to flow onto said holster means and a means for said plurality of electrons to continue flowing on to the wall of said first chamber, (g) within said first chamber, said non-equilibrium ionized plasma means forms a plurality of multiple concentric non-equilibrium cylinders of plasma, surrounding a central axis within said first chamber, wherein said central axis is located between said sharp point of said wedge shape of said dielectric material and said interface plate, (h) when input energy is ceased being supplied from said pulsed electrostatic/electric field energy driven source means, said tip of said conductor means ceases functioning as a first cathode means, causing said sharp point of said dielectric material to cease performing as said first anode means, allowing said sharp point of said dielectric material to begin performing as a second cathode means, (i) when said input energy is ceased being supplied from said pulsed electrostatic/electric field energy driven source means through said brush or corona discharge means, said dielectric material further including a means to release said plurality of fast moving high energy electrons, (j) said plurality of fast moving high energy electrons thereby having said fast leading edge voltage rise time means, provided from said retained energy means previously collected within said dielectric material, (k) said sharp point of said dielectric material begins performing as said second cathode means as said plurality of fast moving high energy electrons, having said fast leading edge voltage rise time means of less than several hundred nanoseconds, flows through said central axis of said innermost cylinder of said nonequilibrium ionized plasma residing within said first chamber towards said interface plate where said interface plate acts as a second anode means receiving said plurality of fast moving high energy electrons, (l) said plurality of fast moving high energy electrons strike said interface plate with sufficient levels of energy creating said bremsstrahlung radiation event means to occur within said interface plate thereby ejecting said plurality of energetic bremsstrahlung photons into said second chamber, (m) said plurality of gaseous molecules of said second gas, or gas mixture, maintained under said pressure means residing within said second chamber are bombarded with said plurality of energetic bremsstrahlung photons providing a means to eject said plurality of free slow-speed high energy electrons from said plurality of gaseous molecules from said second gas, or gas mixture, (n) said plurality of free slow-speed high energy electrons ejected from said plurality of gaseous molecules from said second gas, or gas mixture, having a means to be received by said electron collection means thereby allowing said plurality of free slow-speed high energy electrons to be distributed across the lower energy potential of the outside surface of said second chamber, (o) said plurality of free slow-speed high energy electrons residing on said outside surface of said second chamber having a means to continue flowing onto said outer shield, whereby said plurality of free slow-speed high energy electrons having a means to be drawn off of said exterior surface of said outer shield for use as said source means of current and/or potential for an external load, (p) said pulsed electrostatic/electric field energy driven source having a means to be re-energized to provide a subsequent pulse of said input energy starting a subsequent means of creating additional said plurality of free slow-speed high energy electrons residing on said outer shield, (q) whereby said subsequent means of creating additional said plurality of free slow-speed high energy electrons residing on said outer shield continues for as long as the need for said plurality of free slow-speed electrons to be provided for said source means of current and/or potential energy for use by external loads.

14. A method for creating a source of a plurality of high energy positive ions for use by an external load comprising, (a) a means to project a pulse of electrostatic/electric field energy into a first chamber, (b) a dielectric material providing a capture means of said pulse of electrostatic/electric field energy, and a release means of said electrostatic/electric field energy in the form of a plurality of positive ions, (c) an interface plate with a means to receive said positive ions, whereby said interface plate is located between said first chamber and a second chamber, (d) said interface plate having a means to create a bremsstrahlung emission of a plurality of energetic bremsstrahlung photons into said second chamber when struck by said plurality of positive ions, (e) said plurality of energetic bremsstrahlung photons bombarding a plurality of gaseous molecules residing within said second chamber having a means to force a plurality of high energy positive ions out of the molecular valence levels of said plurality of gaseous molecules, (f) said second chamber having a positive ion collection means and a first connecting means to said second chamber, (g) said outer shield encapsulating said first chamber and said second chamber, having a second connecting means to said second chamber allowing said plurality of high energy positive ions to flow onto an outer shield encapsulating said first chamber and said second chamber whereby said plurality of high energy positive ions are provided for use by an external load.

* * * * *